US006486530B1

(12) United States Patent
Sasagawa et al.

(10) Patent No.: US 6,486,530 B1
(45) Date of Patent: Nov. 26, 2002

(54) INTEGRATION OF ANODIZED METAL CAPACITORS AND HIGH TEMPERATURE DEPOSITION CAPACITORS

(75) Inventors: Teruo Sasagawa, Los Gatos, CA (US); Brian W. Arbuckle, San Ramon, CA (US)

(73) Assignee: Intarsia Corporation, Fremont, CA (US)

( * ) Notice: Subject to any disclaimer, the term of this patent is extended or adjusted under 35 U.S.C. 154(b) by 0 days.

(21) Appl. No.: 09/690,174

(22) Filed: Oct. 16, 2000

(51) Int. Cl.$^7$ .................................................. H01L 29/00
(52) U.S. Cl. ...................... 257/532; 257/43; 257/307; 257/535; 257/640; 257/751; 257/762; 438/393; 438/396
(58) Field of Search ................................. 257/532, 535, 257/640, 642, 649, 751, 753, 762–767, 503, 307, 308, 43; 438/393, 396–399

(56) References Cited

U.S. PATENT DOCUMENTS

| 4,146,439 A | 3/1979 | Randall, Jr. |
| 4,152,679 A | 5/1979 | Chen |
| 4,421,785 A | 12/1983 | Kroger |
| 4,430,662 A | 2/1984 | Jillie, Jr. et al. |
| 4,481,084 A | 11/1984 | Chen et al. |
| 4,481,283 A | * 11/1984 | Kerr et al. .................. 430/319 |
| 4,550,069 A | 10/1985 | Pampalone |
| 4,589,961 A | 5/1986 | Gershenson |
| 4,675,717 A | 6/1987 | Herrero et al. |
| 4,936,957 A | 6/1990 | Dickey et al. |
| 5,070,317 A | 12/1991 | Bhagat |
| 5,071,509 A | 12/1991 | Kano et al. |
| 5,134,539 A | 7/1992 | Tuckerman et al. |
| 5,141,603 A | 8/1992 | Dickey et al. |
| 5,227,012 A | 7/1993 | Brandli et al. |
| 5,241,636 A | 8/1993 | Kohn |
| 5,254,493 A | 10/1993 | Kumar |

(List continued on next page.)

FOREIGN PATENT DOCUMENTS

| JP | 03203261 A | * | 9/1991 |
| JP | 05129522 A | * | 5/1993 |
| JP | 09205179 A | * | 8/1997 |

OTHER PUBLICATIONS

S.G. Byeon and Y. Tzeng, "Improved Oxide Properties by Anodization of Aluminum Films with Thin Sputtered Aluminum Oxide Overlays," Journal of the Electrochemical Society, vol. 135 No. 10, pp. 2452–2458 (Oct. 1988).

T. Dobashi, T. Umezawa, and K. Sasaki, "Effects of Heat–Treatment on Dielectric Properties of Anodized Al–Ta Double Oxide Layer Thin–Film Capacitors," Electronics and Communications in Japan. Part 2. vol. 71, No. 2, pp. 98–105 (1988).

V. Surganov, "Planarized Thin Film Inductors and Capacitors for Hybrid Integrated Circuits Made of Aluminum and Anodic Aumina," IEEE Transactions on Components, Packaging and Manufacturing Technology, Part B, vol. 17, No. 2, pp. 197–200 (May 1994).

(List continued on next page.)

Primary Examiner—Nathan J. Flynn
Assistant Examiner—Remmon R. Fordé
(74) Attorney, Agent, or Firm—Blakely, Sokoloff, Taylor & Zafman LLP (57) ABSTRACT

An integrated passive component device in which an anodized metal capacitor and a HTD capacitor are fabricated with a protective conductive metal layer disposed between the dielectric layer of the anodized metal capacitor and the dielectric layer of the HTD capacitor. The protective conductive metal layer helps to prevent process chemicals and conditions used to fabricate the dielectric layer of the HTD capacitor from adversely affecting the dielectric layer of the anodized metal capacitor. The anodized metal capacitor and the high temperature deposition capacitor are fabricated on the same substrate using only one masking operation.

44 Claims, 10 Drawing Sheets

U.S. PATENT DOCUMENTS

| | | | |
|---|---|---|---|
| 5,258,886 A | 11/1993 | Murayama et al. | |
| 5,304,506 A | 4/1994 | Porter et al. | |
| 5,316,982 A | 5/1994 | Taniguchi | |
| 5,323,138 A | 6/1994 | Oki et al. | |
| 5,355,277 A | 10/1994 | Hoshiba | |
| 5,356,826 A | 10/1994 | Natsume | |
| 5,363,080 A | 11/1994 | Breen | |
| 5,366,920 A | 11/1994 | Yamamichi et al. | |
| 5,370,766 A | 12/1994 | Desaigouder et al. | |
| 5,398,400 A | 3/1995 | Breen | |
| 5,416,356 A | 5/1995 | Staudinger et al. | |
| 5,420,558 A | 5/1995 | Ito et al. | |
| 5,440,157 A | 8/1995 | Imai et al. | |
| 5,442,585 A | 8/1995 | Eguchi et al. | |
| 5,450,263 A | 9/1995 | Desaigouder et al. | |
| 5,478,773 A | 12/1995 | Dow et al. | |
| 5,481,131 A | 1/1996 | Staudinger et al. | |
| 5,488,008 A | 1/1996 | Kawamura | |
| 5,503,878 A | 4/1996 | Suzuki et al. | |
| 5,528,083 A | 6/1996 | Malladi et al. | |
| 5,918,135 A * | 6/1999 | Lee et al. | 438/393 |
| 6,160,270 A * | 12/2000 | Holmberg et al. | 257/59 |

OTHER PUBLICATIONS

C.W. Liang et al., "Characterization of anodic aluminum oxide film and its application to amorphous silicon thin film transistors," Materials Chemistry and Physics 43, pp. 166–172 (1996).

G.C. Schwartz and V. Platter, "An Anodic Process for Forming Planar Interconnection Metallization for Multilevel LSI," Journal of Electrochemical Society, pp. 1508–1516 (Nov. 1975).

W.J. Bernard and J.W. Cook, "The Growth of Barrier Oxide Films on Aluminum," Journal of the Electrochemical Society, pp. 643–646 (Aug. 1959).

T. Takken and D. Tuckerman, "Integral Decoupling Capacitance Reduces Multichip Module Ground Bounce," IEEE Multichip Module Conference, Santa Cruz, California (Mar. 1993).

R.R. Kola et al, "Thin Film Resistors and Capacitors for Advanced Packaging," International Symposium on Advanced Packaging Materials, pp. 71–74 (Mar. 1997).

Product Bulletin for AZ P4000 Photoresist, Hoechst Celanese, 1995.

W.F. Gum et al., "Reaction Polymers: Polyurethanes, Epoxies, Unsaturated Polyesters, Phenolics, Special Monomers, and Additives," Chemistry, Technology, Applications, Markets, pp. 65–79, 91–96 Hanser Publishers (1992).

N.H. Kordsmeier, Jr. et al., "Electronic Materials and Processes,Advanced Packaging Concepts—Microelectronics Multiple Chip Modules Utilizing Silicon Substrates," Society for the Advancement of Material and Process Engineering, 1st International Sampe Electronics Conference, vol. 1 pp. 36–45, Doubletree Hotel, Santa Clara, California (Jun. 23–25, 1987).

F.F. Mazda, "Electronics Engineer's Reference Book," Sixth Edition, pp. 26/3–26/12 (1989).

Elizabeth Logan, et al., "Advanced Packaging of Integrated Passive Devices for RF Applications," "Preliminary VCO Layout" and "RF Component Integration." (Aug. 12, 1998).

David J. Elliot, "Integrateed Circuit Fabrication Technology," pp. vii–xvii, 1–86, 101–163, 233–309, McGraw–Hill (1982).

R.H. Perry et al., "Perry's Chemical Engineer's Handbook," Sixth Edition, p. 23/48, McGraw–Hill (1984).

Gretchen M. Adema, Lin–Tyng Hwang, Glenn A. Rinne, and Iwona Turlik, "Passivation Schemes for Copper/Polymer Thin–Film Interconnections Used in Multichip Modules," IEEE Transactions of Components, Hybrids, and Manufacturing Technology, vol. 16, No. 1, pp. 53–59, Feb. 1993).

* cited by examiner

INTEGRATION OF ANODIZED METAL CAPACITORS AND HIGH TEMPERATURE DEPOSITION CAPACITORS

FIELD OF THE INVENTION

The present invention relates generally to thin film integrated component devices, and more specifically to an improved fabrication process that involves fabricating both anodized metal capacitors and high temperature deposition (HTD) capacitors within the same device with a minimum number of mask operations.

BACKGROUND OF THE INVENTION

Given the trend of the miniaturization of electronics for devices such as cell phones and personal digital assistants (PDAs), the use of thin film integrated component devices is increasing. Active and passive components can be integrated on a thin film substrate material such as glass or ceramic. Integrated capacitors can be formed on the substrate in several ways. Examples of methods are the anodized metal method and the HTD method.

The anodized metal method of fabricating a capacitor on a thin film substrate consists of depositing a layer of conductive metal (e.g., aluminum, tantalum, or other anodizable metal) on the thin film substrate, coating the metal layer with a photoresist layer, and forming a metal oxide layer (i.e., the capacitor's dielectric layer) from the metal layer. After the metal oxide layer is formed, the photoresist layer is stripped. The conductive metal layer and the metal oxide layer are then cleaned using an etching process and a final conductive metal layer is deposited to form the integrated capacitor.

The high temperature deposition method of fabricating a capacitor on a thin film substrate consists of depositing a conductive metal layer (e.g., aluminum) on the thin film substrate, followed by the deposition at high temperature of a dielectric layer (e.g., silicon nitride). A photoresist layer is deposited and the dielectric layer is then etched. A final conductive layer is deposited to form the integrated capacitor.

These two types of capacitors have distinctive properties, which are preferable depending upon the application. An anodized metal capacitor is preferable when a large capacitance is required. Because it is composed of high capacitance density material the desired capacitance can be realized with a capacitor of manageable size. Similarly, if a small capacitance is desired, using a high density capacitor would mean the size of the capacitor would have to be extremely small. In small capacitance applications, using a high temperature deposition capacitor (e.g., silicon nitride capacitor) is preferable.

For some applications it may be desirable to have both types of capacitor as part of the same integrated circuit. The integration of the devices is problematic in that the fabrication process of one device may cause defects in another device on the same substrate.

For example, if the anodized metal capacitor is fabricated first, then the etching process of the high temperature deposition capacitor may destroy the anodized metal layer of the capacitor. If the high temperature deposition capacitor is fabricated first, then the aluminum layer may experience hillocking. Hillocking may occur due to the deposition of the thin film dielectric which is done at temperatures above that at which the aluminum layer is deposited. This may cause the aluminum to recrystalize to relieve stress in the film. The recrystalization causes small hillocks (bumps) on the metal's surface. These defects can cause the film to break when a potential is applied. Anodization is difficult to do successfully on aluminum with hillocks. The anodized layer on aluminum with hillocks is more likely to break down at lower voltages. Also, the hillocks can sometimes become sufficiently large so as to grind through the insulating levels and short-circuit a component.

SUMMARY OF THE INVENTION

An integrated passive component device is described comprising a first capacitor of a first of a first type and a second capacitor of a second type. A protective conductive metal layer is disposed between the dielectric layer of the first capacitor and the dielectric layer of the second capacitor. The protective conductive metal layer helps to prevent process chemicals and conditions, used to fabricate the dielectric layer of the second capacitor, from adversely affecting the dielectric layer of the second capacitor. The two types of capacitors are fabricated on the same substrate using only one masking operation.

An improved method for fabricating anodized capacitors and high temperature capacitors on the same device is also described. The improvement comprises depositing a protective conductive metal layer as the top conducting plate of the anodized capacitor. The protective conductive metal layer protects the anodized metal layer of the anodized metal capacitor from the etching process of the high temperature deposition capacitor.

Other features and advantages of the present invention will be apparent from the accompanying drawings and from the detailed description that follows below.

BRIEF DESCRIPTION OF THE DRAWINGS

The present invention is illustrated by way of example and not limited in the figures of the accompanying drawings in which like references indicate similar elements and in which.

DETAILED DESCRIPTION

As will be discussed in more detail below, one embodiment of the present invention is a thin film integrated passive component device integrating anodized metal capacitors and high temperature deposition (HTD) capacitors. A method of fabricating anodized metal capacitors and HTD capacitors is described. In one embodiment of the present invention a protective conductive metal layer is deposited as the top conductive metal layer of the anodized metal capacitor.

An intended advantage of one embodiment of the invention is to avoid hillocking of the conductive metal layer of the device. Another intended advantage of one embodiment of the invention is to protect the anodized metal layer of the anodized metal capacitor from the etching process of the HTD capacitor. Another intended advantage of one embodiment of the invention is to maintain uniform thickness of the anodized metal layer of the anodized metal capacitor.

Figure 1:
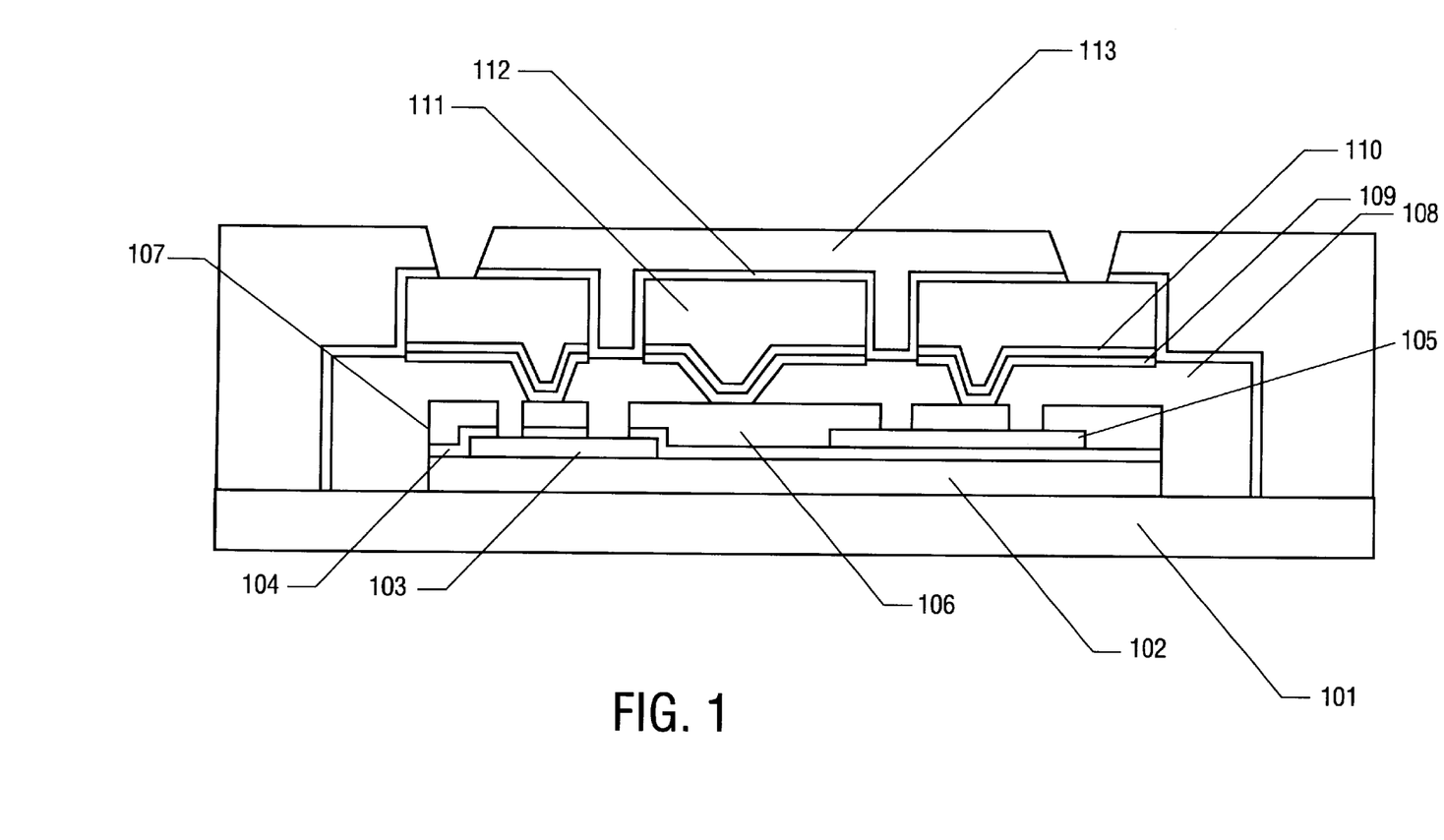
FIG. 1 is an overview of a device integrating an anodized metal capacitor and a HTD capacitor according to one embodiment of the present invention.

FIG. 1 provides an overview of the material layers of a thin film integrated passive component device integrating an anodized metal capacitor and an HTD capacitor in accordance with one embodiment of the present invention. The overview 100 of FIG. 1 shows a substrate 101, substrate 101 could be glass, ceramic, silicon, or another material exhibiting like properties.

Deposited on the substrate is a conductive metal layer 102 used to form the anodized metal capacitor. For alternative embodiments a resistive layer could be deposited on substrate 101 to form integrated resistors. Alternatively, an adhesion layer could be deposited on substrate 101 where conductive metal layer 102 requires an adhesion layer to adhere to substrate 101. If a resistive layer, an adhesion layer, or a combination thereof is deposited upon substrate 101, conductive metal layer 102 is deposited upon such a layer. Conductive metal layer 102 could be aluminum and/or tantalum, or a multi-layer of aluminum and other conductive metals (e.g., aluminum alloy, copper, silver, gold, etc.). For one embodiment aluminum is the top of the multi-layer structure.

Formed on the surface of conductive layer 102 is metal oxide layer 103. Metal oxide layer 103 forms the dielectric layer of the anodized metal capacitor. Metal oxide layer 103 is aluminum oxide for one embodiment.

Deposited on metal oxide layer 103 is protective conductive metal layer 104. Protective conductive metal layer 104 is a conductive metal layer that is aluminum for one embodiment, but that could also be aluminum alloy, copper, gold, molybdenum, silver, or silver alloy, tantalum, titanium, tungsten, and other metals and alloys. Protective conductive metal layer 104 helps to ensure uniform thickness of metal oxide layer 103 and helps to protect metal oxide layer 103 from the etching process during the fabrication of the HTD capacitor discussed below.

Dielectric film layer 105 is deposited on protective conductive metal layer 104. Dielectric film layer 105 forms the dielectric layer of the HTD capacitor. Dielectric film layer 105 could be silicon nitride, silicon dioxide, silicon oxynitride, aluminum oxide, tantalum oxide, titanium oxide, or organic dielectric films such as Benzocyclobutene (BCB), Avatrel™ hydrocarbon, polyimide, or similar materials.

Conductive metal layer 106 is deposited on protective conductive metal layer 104 and on dielectric film layer 105. Conductive metal layer 106 forms the top conductive plate of both types of capacitors. Conductive metal layer 106 could be aluminum, aluminum alloy, copper, silver, gold, titanium, molybdenum, tungsten, tantalum, or other materials with similar properties.

Following the conductive metal layer 106 is an inorganic cap film layer 107, which could be silicon nitride, silicon dioxide, silicon-oxynitride, or other similar materials, or a multilayer of these materials. An embodiment of the invention minimizes the number of times this masking operation must be employed.

The inorganic cap film layer 107 is followed by an interlayer dielectric film layer 108 that could be Benzocyclobutene (BCB), polyimide, or other organic dielectric film.

Following the interlayer dielectric film layer 108 is an adhesion layer 109 that could be titanium, tantalum, tungsten or like materials, and a copper seed layer 110.

The adhesion layer 109 and the copper seed layer 110 are used as an adhesion layer between the organic polymer 108 and the final conductive metal layer 111. The final conductive metal layer 111 may be copper, aluminum, aluminum alloy, gold, silver, a multilayer such as copper/nickel/gold, or similar materials.

A final layer of inorganic dielectric 112 is deposited followed by passivation layer 113. The inorganic dielectric layer 112, which could be silicon nitride, silicon dioxide, silicon-oxynitride, or other similar materials, or a multilayer of these materials acts as a passivation adhesion layer between conductive metal layer 110 and passivation layer 113. Passivation layer 113 could be BCB, polyimide, or another organic dielectric film.

FIGS. 2–12 depict the operations of a fabrication process according to one embodiment of the present invention. For the embodiment described in reference to FIGS. 2–12 the dielectric layer of the anodized metal capacitor (i.e., metal oxide layer 103) is fabricated before the dielectric layer of the HTD capacitor (i.e., dielectric film layer 105). Nevertheless, the order of fabrication can be reversed, as discussed below.

Figure 2:
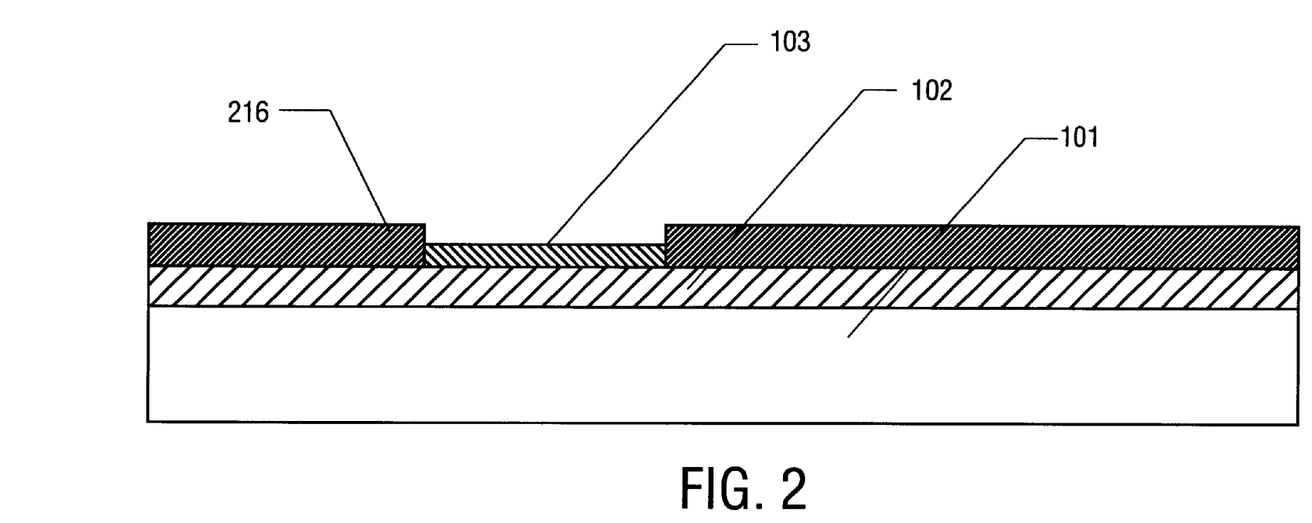
FIG. 2 shows a substrate, conductive metal layer, a photoresist layer and a metal oxide layer of one embodiment of the present invention.

FIG. 2 shows substrate 101, conductive metal layer 102 a photoresist layer 216 and metal oxide layer 103. In FIG. 2, the conductive metal layer 102 is deposited onto a substrate 1 by a sputtering process. For this embodiment, a Corning 1737 F glass substrate, available from Corning Glass Co. of Corning, N.Y., is used as the glass substrate 101 and aluminum is used as the conductive metal layer 102. For one embodiment, the glass substrate 101 is a glass panel 101.

The equipment used in the sputtering process could be a Kurdex V3000 sputtering system available from Kurdex of Fremont, Calif. The sputter process conditions are as follows. The aluminum is deposited with a condition of Ar 100 sccm, 4000 W, scan speed 82 mm/min, and 1 mTorr. The panel is passed twice to have a nominal thickness of the aluminum layer (i.e., conductive metal layer 102) of approximately 2.5 microns.

Conductive metal layer 102 is coated with a photoresist layer 216. For one embodiment, a positive photoresist is used. In particular, for one embodiment, the positive photoresist is one of the AZ™ 4000 series of photoresists manufactured by Hoechst Celanese of Somerville, N.J. Alternative embodiments use other photoresist processes, including positive or negative photoresist processes. The thickness of the photoresist needs to be optimized for the specific process. If the photoresist is too thin, the photoresist will not have sufficient chemical resistance. If the photoresist is too thick, the precise pattern definition will be more difficult to achieve. For certain embodiments of the invention, photoresist thickness can range from about 1 micron to 10 microns, but other thicknesses are possible. The structure on glass panel 101 is coated with a positive AZ-4330 on an FSI FP-BGBCD spin coater, available from FSI of Fremont, Calif. An embodiment for this invention is to have glass panel patterning done on a MRS 5001-HT stepper, available from MRS of Chelmsford, Mass. The preferred hard bake for photoresist layer 216 is the minimum temperature required to perform successful anodization. In particular, for the AZ-4330 photoresist, the hard bake temperature is approximately between 170 degrees Centigrade and 220 degrees Centigrade for approximately 30 minutes plus or minus five minutes. The preferred temperature is approximately 190 degrees. The hard baking occurs in a Blue M electric oven available from SPX Corporation of Muskegon, Mich.

After coating with photoresist, the structure on glass panel 101 is anodized to produce a metal oxide layer 103. For an embodiment using aluminum as the conductive metal layer 102, the metal oxide layer is a layer of aluminum oxide $Al_2O_3$.

Anodization occurs by applying to the top of the structure on glass panel 101 a mixture of ammonium pentaborate in an ethylene glycol solution. The pH of the solution is maintained between approximately 5.0 and 5.5. The temperature of the solution is approximately 15–30 degrees Centigrade.

The anodization parameters comprise a forming voltage of approximately 130 volts, a current density of approximately 0.1–10 mA/cm$^2$, and a total anodization time of approximately 1–30 minutes. The thickness of the metal oxide layer 103 is approximately 0.15–0.2 microns. After anodization, the photoresist layer 216 is stripped using a stripper.

The next operation in the process flow is to perform a radio frequency ("RF") plasma etch on the top of the panel to clean the top surface of conductive metal layer 102 and metal oxide layer 103. The RF plasma etch cleans conductive metal layer 102 and metal oxide layer 103, but the RF plasma etch does remove a small amount of the metal oxide layer 103. The RF plasma etch typically removes approximately 0.004 to 0.005 microns of the 0.15–0.2 micron thickness of metal oxide layer 103. For one embodiment, the RF plasma etch is done in a Kurdex V3000 sputtering system, available from Kurdex of Fremont, Calif. The sputtering system uses argon ions in an RF plasma to bombard conductive metal layer 102 and metal oxide layer 103. The sputtering machine is calibrated based on a known thickness of the metal oxide layer 103. For one embodiment, the RF plasma etch typically takes approximately 2 minutes. For an alternative embodiment the sputtering uses in situ RF plasma etching for approximately 120 seconds for a glass panel.

Figure 3:
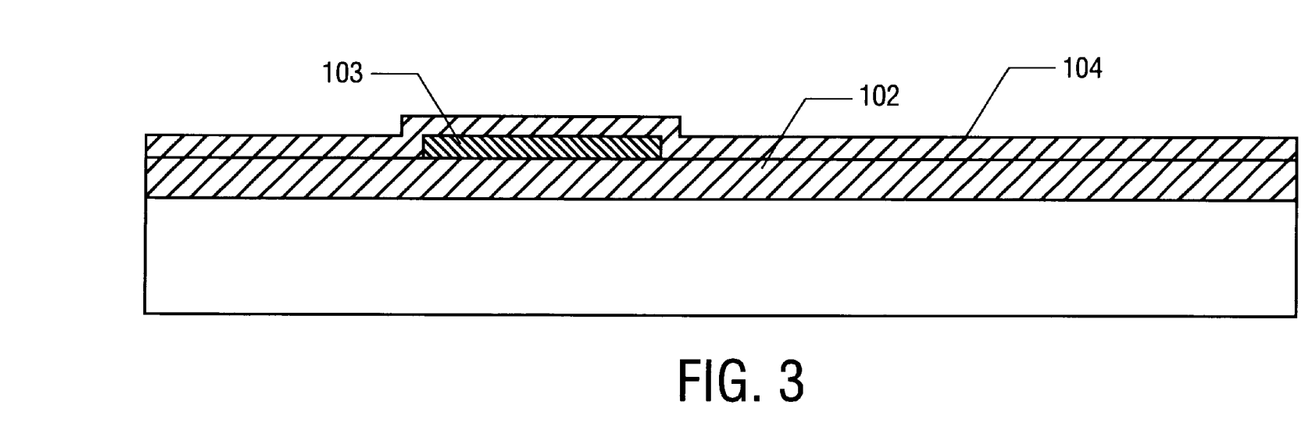
FIG. 3 shows the removal of the photoresist layer and the addition of a protective conductive metal layer according to one embodiment of the present invention.

FIG. 3 shows the deposition of protective conductive metal layer 104 on top of conductive metal layer 102 and metal oxide layer 103. For one embodiment, the protective conductive metal layer 104 is aluminum. For an alternative embodiment, the protective conductive metal layer 104 is a conductive metal that exhibits sufficient adhesion to the metal oxide layer 103 and exhibits sufficient resistance to the etching process described below in reference to the fabrication of the HTD capacitor. The metal used for protective conductive metal layer 104 need not be the same metal used for conductive metal layer 102. For one embodiment, however, the same metal is used in protective conductive metal layer 104 as used in conductive metal layer 102. For one embodiment, aluminum is used for both layers.

The thickness of the protective conductive metal layer 104 depends upon the metal and is controlled by the desired etch resistance to the etch process described below. If the thickness is too thin, the protective conductive metal layer 104 would be partially or completely removed by the etch process. As a result, the metal oxide layer 103 would be damaged and thus lower the breakdown voltage and increase the capacitance density. This would make it more difficult to maintain the desired performance of the metal oxide capacitor. If the thickness is too great, it would be more difficult to control the etch tolerance of the HTD capacitor.

For one embodiment of the invention, the thickness of the protective conductive metal layer 104 is approximately 0.1 microns. The range of the thicknesses used can be 0.01–1.0 microns, but other thicknesses are also possible.

For an embodiment for a glass panel, the protective conductive metal layer 104 is deposited by a sputter process using aluminum in a Kurdex V3000 sputtering system. The sputter conditions are as follows. The sputtering starts with in situ RF plasma etching for approximately 120 seconds, followed by an aluminum deposition with a condition of Ar 100 sccm, 4000 W, Scan Speed 498 mm/min, 2 mTorr. This results in a nominal thickness of the aluminum (protective conductive metal layer 104) of approximately 0.1 microns.

Figure 4:
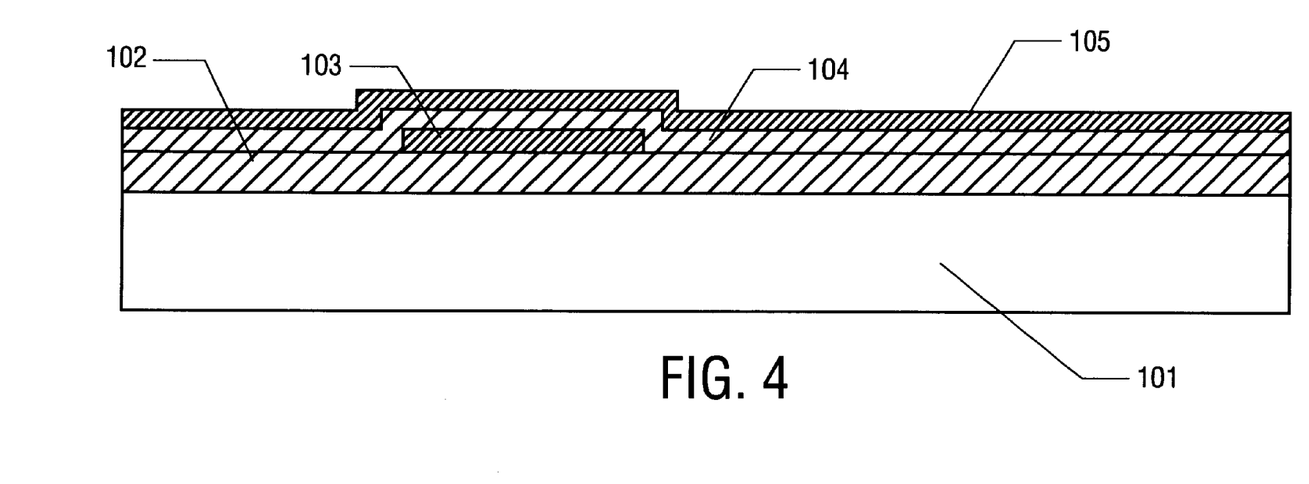
FIG. 4 shows the addition of a dielectric film layer.

FIG. 4 shows the deposition of dielectric film layer 105 to form an HTD capacitor. For one embodiment, silicon nitride (SiNx) is used. For one embodiment of the invention, the SiNx layer (dielectric film layer 105) is deposited by a Plasma Enhanced Chemical Vapor Deposition (PECVD) system using a model AKT1600 CVD system of Applied Komatsu Technology of Santa Clara, Calif. The PECVD condition used is SiH4/NH3/N2=100/500/3500 sccm, 1.2 Torr, 1200 W, 320° C., and 340 seconds, which results in a thickness of the SiNx of approximately 0.65 microns. Other techniques for the dielectric film depositions include sputter, evaporation, APCVD (Atmospheric CVD), LPCVD (Low Pressure CVD), Laser Ablation deposition, ECR plasma CVD, spin coat, extrusion coat, roller coat, etc. Other materials that can be used as a dielectric film are silicon dioxide, silicon-oxy-nitride, aluminum oxide, tantalum oxide, titanium oxide, BCB, Avatrel™ hydrocarbon, polyimide, etc., and the combination of these films.

Figure 5:
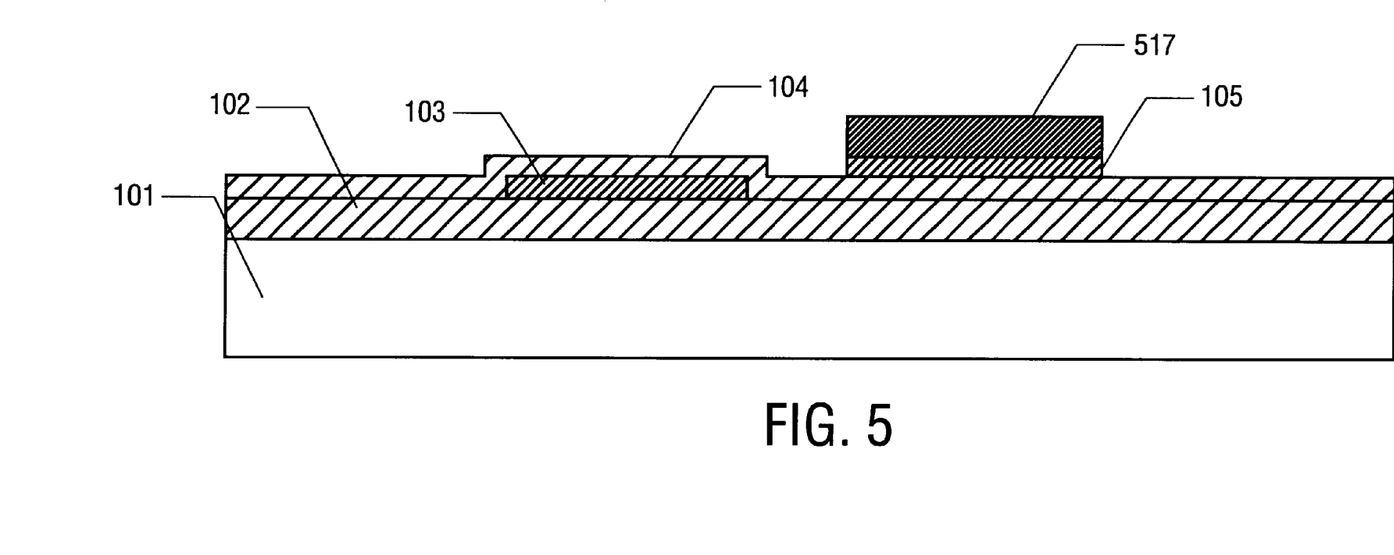
FIG. 5 shows the remaining dielectric film, after etching, under the photoresist layer.

FIG. 5 shows the deposition of a photoresist layer 517 on top the dielectric film layer 105. The process for depositing photoresist layer 517 is as follows for one embodiment. The structure on glass panel 101 is coated with a positive AZ-4330 photoresist on an FSI FP-BGBCD spin coater. The resulting thickness of photoresist layer 517 is approximately 3.7 microns plus or minus 0.1 microns. The glass panel 101 is then automatically transferred to a hot plate for soft baking at approximately 110 degrees Centigrade for approximately 2 minutes. The patterning of the structure on glass panel 101 is accomplished using a MRS 5001-HT stepper. The pattern is developed in a 4 to 1 mixture of water and the developer AZ 400K. Then the substrate 101 is hard baked at a temperature of approximately 125 degrees Centigrade for approximately 30 minutes.

The next operation is etching of the dielectric film layer 105. For one embodiment, SiNx is used as the dielectric film layer 105. The SiNx is etched using a Reactive Ion Etch (RIE) process in a model AKT1600 ETCH system. The RIE conditions used are $SF_6/O_2/Ar$=300/10/150 sccm, 40 mT, and 900 W, which results in etching 0.65 microns of the SiNx in approximately 200 seconds. For one embodiment of the invention, the protective conductive metal layer 104 has a high level of etching resistance to the fluorine-based dry etch. This serves to protect the metal oxide layer 103 from dry etching of the dielectric film layer 105. After dry etching of the dielectric film layer 105, the photoresist layer 517 is stripped. In this operation, the dielectric layer for the HTD capacitor is patterned.

Figure 6:
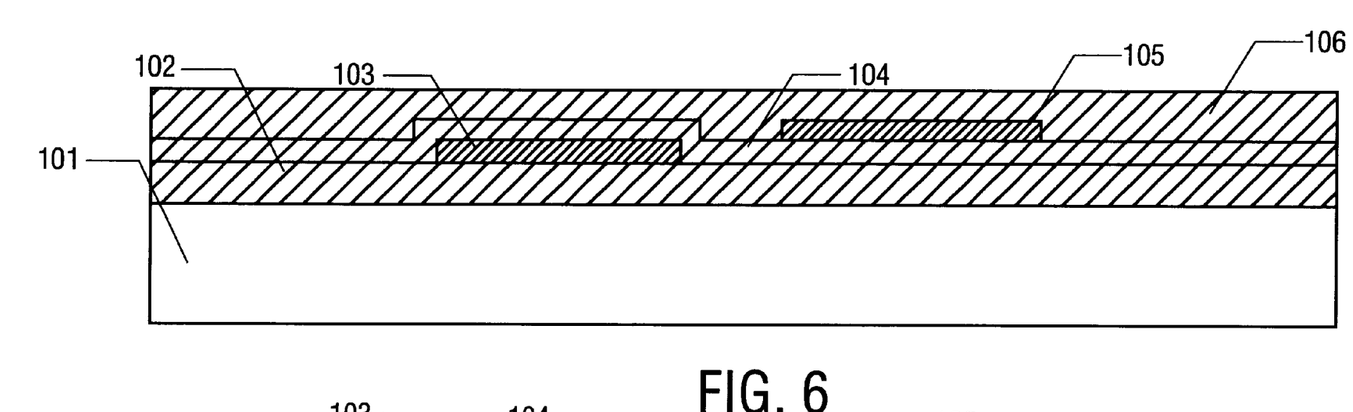
FIG. 6 shows the addition of a conductive metal layer.

FIG. 6 shows the deposition of conductive metal layer 106 on top of protective conductive metal layer 104 and dielectric film layer 105. For one embodiment, conductive metal layer 106 is aluminum. For an alternative embodiment, conductive metal layer 106 may be a conductive metal that exhibits sufficient adhesion to the dielectric film layer 105 and the protective conductive metal layer 104. Examples of metals that can be used for conductive metal layer 106 include aluminum alloy, copper, gold, etc. For alternative embodiments, conductive metal layer 106, conductive metal layer 102, and protective conductive metal layer 104 can be different metals selected from the same group of metal as discussed above. That is, the metal used for conductive metal layer 106 need not be the same metal used for conductive metal layer 102 or protective conductive metal layer 104.

The thickness of conductive metal layer 106 depends upon the metal used, and is controlled by the desired electrical performance of the capacitor.

For an alternative embodiment for a glass panel, the conductive metal layer 106 is aluminum. For one embodiment, the aluminum is deposited by a sputter process using a Kurdex V3000 sputtering system. The sputter conditions are as follows. The sputtering starts with in situ RF plasma etching for approximately 120 seconds, followed by an aluminum deposition with a condition of Ar 100 sccm, 4000 W, scan Speed 87 mm/min, and 1 mTorr. The panel is passed twice to have a nominal thickness of the aluminum layer (i.e., conductive metal layer 106) of approximately 1.15 microns.

Figure 7:
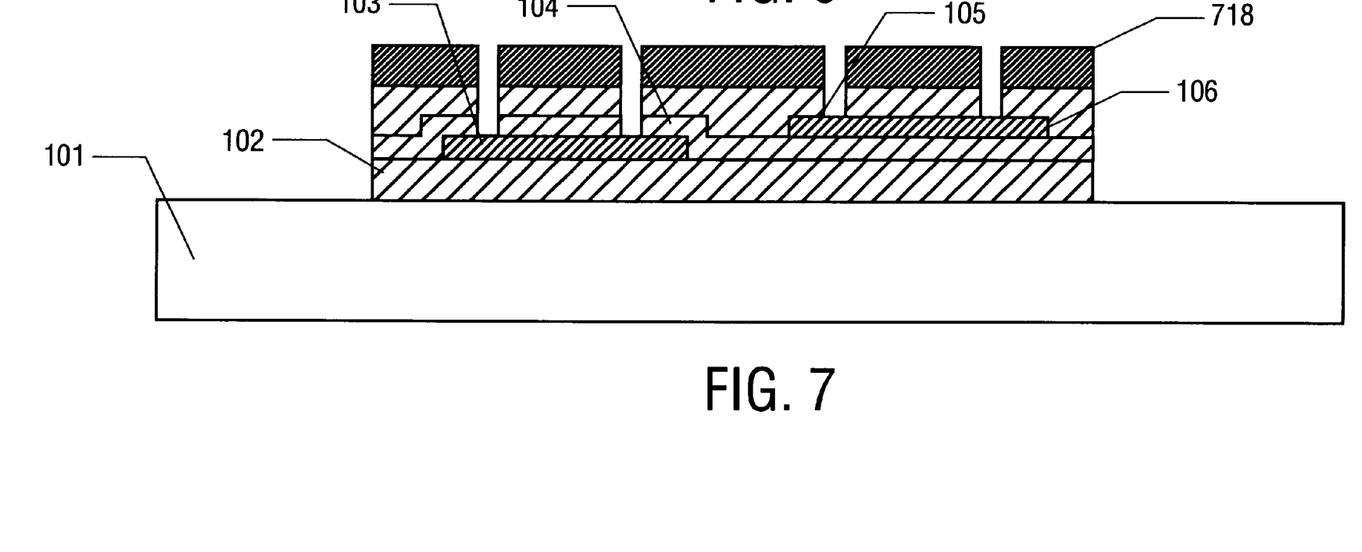
FIG. 7 shows the remaining conductive metal layer, after etching, under the photoresist layer.

FIG. 7 shows the deposition of a photoresist layer 718 on top of conductive metal layer 106. The process for depositing photoresist layer 718 is as follows for one embodiment. The structure on glass panel 101 is coated with a positive AZ-4330 on a FSI FP-BGBCD spin coater. The resulting thickness of photoresist layer 718 is approximately 3.7 microns, plus or minus 0.1 microns. The glass panel 101 is then automatically transferred to a hot plate for soft baking at approximately 110 degrees Centigrade for approximately 2 minutes. The patterning of the panel is accomplished using a MRS 5001-HT stepper. The pattern is developed in a 4 to 1 mixture of water and the developer AZ 400K.

The next operation in the process flow is to hard bake glass panel 101 at a temperature of approximately 125 degrees Centigrade for approximately 30 minutes.

The structure on glass panel 101 is then etched with photoresist layer 718, metal oxide layer 103 and dielectric film layer 105 acting as etch stops. The etching operation described above is carried out in a solution that contains acetic acid, nitric acid, and phosphoric acid. The solution is commercially available and known to one skilled in the art. The solution temperature is controlled to be approximately 40 degrees Centigrade plus or minus two degrees Centigrade. The etching time is approximately 20 minutes. After wet etching conductive metal layer 102, protective conductive metal layer 104, and conductive metal layer 106, the photoresist layer 718 is stripped. For this embodiment, both the anodized metal capacitor and the HTD capacitor are formed in this operation.

Figure 8:
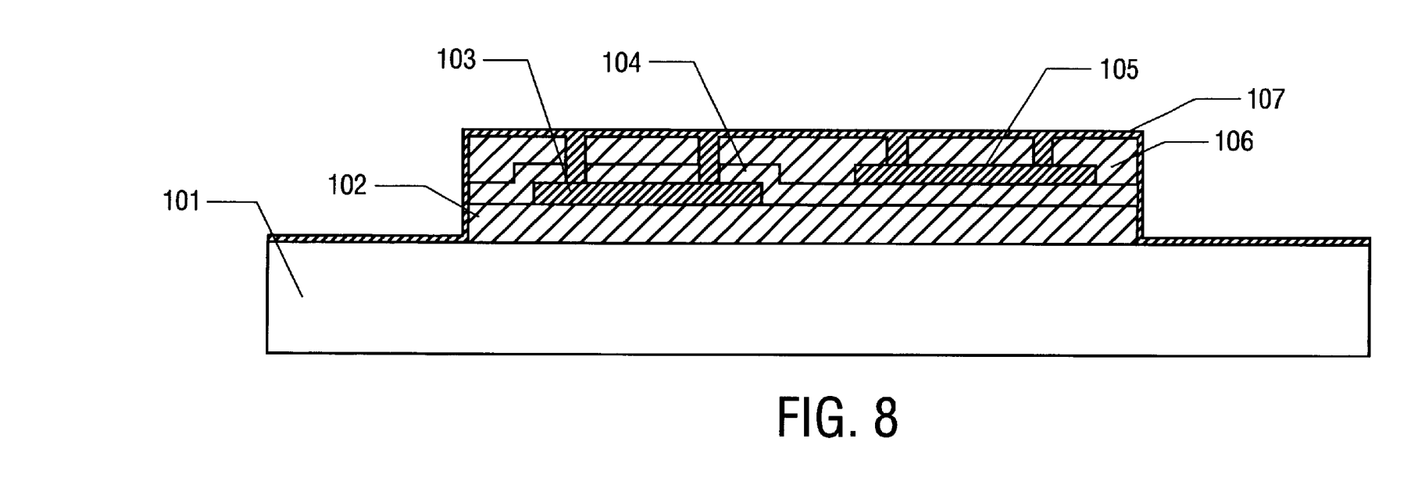
FIG. 8 shows the addition of the inorganic film cap.

FIG. 8 shows the deposition of an impervious inorganic cap film layer 107 to cap the major device layers. For one embodiment, silicon nitride is used. For one embodiment, the SiNx layer (i.e., inorganic cap film layer 107) is deposited by a Plasma Enhanced Chemical Vapor Deposition (PECVD) system in a model AKT1600 CVD system. The PECVD condition used is SiH4/NH3/N2=175/500/3500 sccm, 1.1 Torr, 900 W, 320 C, and 340 seconds, which results in a thickness of approximately 0.55 microns. The other techniques for the inorganic film deposition include sputter, evaporation, APCVD (Atmospheric CVD), LPCVD (Low Pressure CVD), Laser Ablation Deposition, ECR Plasma CVD, spin on glass, etc. Other materials which can be used as an impervious inorganic film include silicon dioxide, silicon-oxynitride, aluminum oxide, tantlum oxide, etc., and the combination of these films.

Figure 9:
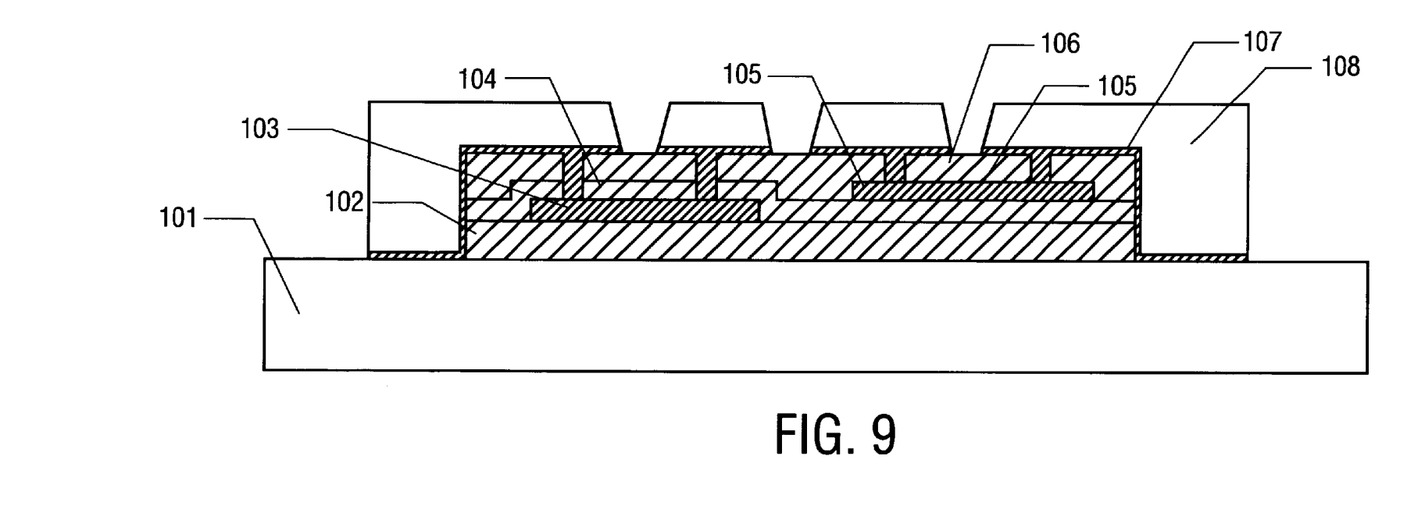
FIG. 9 shows the addition of a dielectric film layer.

FIG. 9 shows the deposition of a dielectric film layer 108. For one embodiment of the invention, BCB is used. The process for depositing BCB as dielectric film layer 108 is as follows for one embodiment. The substrates are coated with a 34% diluted BCB 4024-40 on a FSI FP-BGBCD spin coater. The spin speed is 900 rpm. The resulting thickness of the BCB layer (dielectric film layer 108) is approximately 5 microns plus or minus 0.5 microns. The glass panel is then automatically transferred to a hot plate for soft baking at approximately 75 degrees Centigrade for approximate 3 minutes. The patterning of the panel is accomplished using a MRS 5001-HT stepper. The exposure is 700 mJ/cm$^2$. The pattern is developed in the developer DS2100 supplied by Dow Chemical of Midland Mich.

The next operation in the process flow is to hard bake the panel in a nitrogen purged oven. The hard baked temperature is approximately 210 degrees Centigrade for approximately 40 minutes. Including ramp up and ramp down, the total baking time is approximately 4 hours. The oxygen concentration is less than 100 ppm. The hard baking occurs in a Blue M electric oven.

The next operation is the BCB descum and etching of the dielectric film layer 108. For one embodiment, the BCB descum and the dry etch are performed by a Reactive Ion Etch (RIE) process in a model AKT1600 ETCH system. The descum condition used is O$_2$/CF$_4$=80/20 sccm, 80 mT, 1000 W, and 60 seconds, which results in etching 600–800 Å BCB. The dry etch condition used is SF6/O2/Ar=300/10/150 sccm, 40mT, and 900 W, which results in etching 0.55 microns of the dielectric film in approximately 160 seconds. The etching end point is detected by an optical endpoint detector.

Figure 10:
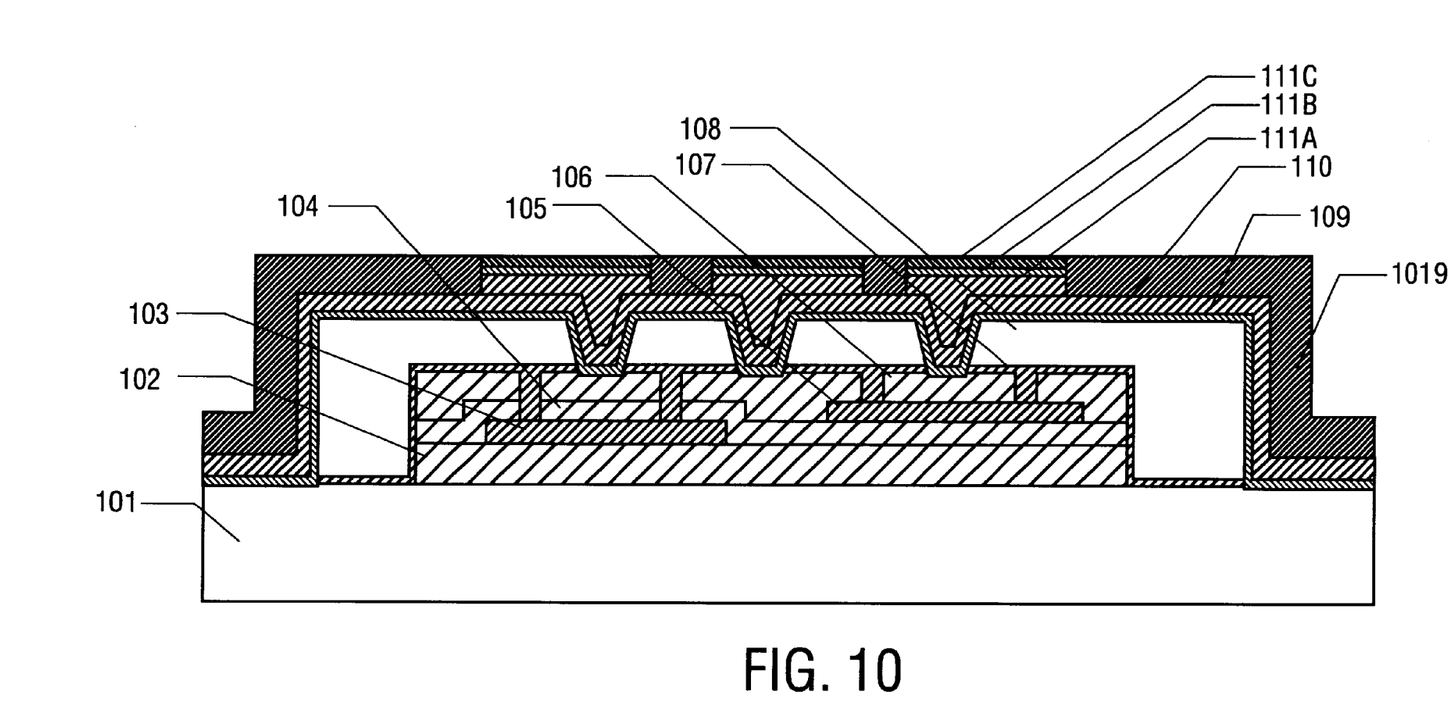
FIG. 10 shows the addition of an adhesion layer, a copper seed layer, and a copper-nickel-gold plated layer in the photoresist patterned area.

FIG. 10 shows the deposition of an adhesion layer 109 and a copper seed layer 110 for embodiments that require plating (e.g. embodiments having layers of gold, silver, nickel, copper, or multi-layers thereof). For embodiments that do not require electroplating, the copper seed layer is not required. For one embodiment, titanium is deposited as adhesion layer 109 and a thin copper layer is deposited as copper seed layer 110. For one embodiment, the adhesion layer 109 and the copper seed layer 110 are deposited by a sputter process a Kurdex V3000 sputtering system. The sputter conditions are as follows. The sputtering starts with in situ RF plasma etching for approximately for 175 seconds, followed by a titanium deposition with a condition of Ar 100 sccm, 3150 W, scan speed 800 mm/min, and 10 mT, which results in a nominal thickness of the titanium of adhesion layer 109 of approximately 0.03 microns. After the adhesion layer 109 deposition, the copper seed layer 110 is deposited with a condition of Ar 100 sccm, 5000 W, scan speed 485 mm/min, and 10 mTorr, which results in a nominal thickness of the copper seed layer 110 of 0.2 microns.

The next operation in the process flow involves depositing a photoresist layer 1019 on top of copper seed layer 110 and the final conductive metal layer 111. The final conductive metal layer 111 may be copper, aluminum, aluminum alloy, gold, silver, a multilayer such as copper/nickel/gold, or similar materials. In FIG. 10, the final conductive metal layer 111 is shown as layers of copper 111a, nickel 111b and gold 111c, that may be plated to form electrical interconnecting structures, bonding pads, and solder ball pads. The layers 111a, 111b, and 111c may form other types of passive components, such as inductors and BCB capacitors.

The process for depositing photoresist layer 1019 is as follows for one embodiment. The structure on the glass panel 101 is coated with a positive AZ-4330RS on a FSI FP-BGBCD spin coater. The resulting thickness of photoresist layer 1019 is approximately 8 microns plus or minus 0.2 microns. The glass panel is then automatically transferred to a hot plate for soft baking at approximately 110 degrees Centigrade for approximately 3 minutes. The patterning of the structure on glass panel 101 is accomplished using a MRS 5001-HT stepper. The pattern is developed in a 4 to 1 mixture of water and the developer AZ 400K.

Alternative embodiments of the invention use other photoresist processes, including positive or negative photoresist processes.

The thickness of the photoresist needs to be optimized to the specific process. The thickness of the photoresist must be thicker than the combined plating metal copper 11a, nickel 111b and gold 111c, so that those metals can grow in the patterned area. If the photoresist is too thin, the metal grows out of the photoresist-defined area and causes pattern defects or short circuits of the interconnection. If the photoresist is too thick, the precise pattern definition will be more difficult to achieve. For an embodiment of the invention with a plating thickness of approximately 8 microns, the photoresist layer 1019 can have a thickness of approximately 8–15 microns, but a thicker photoresist layer is possible as long as pattern definition is achievable.

The next operation is hard bake. The preferred hard bake for photoresist layer 1019 is the maximum temperature required for successful plating. If the temperature is too high, the photoresist flows and cannot maintain straight vertical sidewalls. If the temperature is too low, the photoresist may not have enough adhesion to the copper. This causes photoresist lifting during the electroplating process. In particular, for the AZ-4330RS photoresist, the hard bake temperature is approximately 90 degrees Centigrade plus or minimum 10 degrees Centigrade for approximately 45 minutes plus or minus five minutes. The hard baking occurs in a Blue M electric oven.

The next operation is the photoresist descum. For one embodiment of this invention, the photoresist descum is performed by a Reactive Ion Etch (RIE) process in a model AKT1600 ETCH system. The descum condition used is $O_2$=200 sccm, 80 mT, 1000 W, and 90 seconds, which results in etching 0.2 microns photoresist.

As the next operation in the process flow, the panels are plated to produce a layer 111a of copper, a layer 111b of nickel and a layer 111c of gold. The plating process is performed by an Amerimade Plating Module of Amerimade Technology of Pleasanton, Calif. The copper plating occurs by applying to the top of the substrate a mixture of copper sulfate concentrate, sulfuric acid, hydrochloric acid, and Technic FB Brightener available from Technic Inc., of San Jose, Calif. The plating parameters comprise a current density of approximately 20 A/ft$^2$, and a total plating time of approximately 15 minutes. The thickness of the copper layer 11a is approximately 5 microns plus or minus 1 micron. The nickel plating is performed in a mixture of nickel sulfamate concentrate, boric acid, Technic 3009B brightener and sulfamic acid. The plating parameters comprise a current density of approximately 15 A/ft$^2$, and a total plating time of approximately 4 minutes. The thickness of the nickel layer 12 is approximately 1 micron plus or minus 0.2 microns. The gold plating is performed in a mixture of Technic ACR 40 Gold Salt, Acr 40 CS Conducting Salt, and ACR 434B Brightener. The mixture is commercially available and known to one skilled in the art. The plating parameters comprise a current density of approximately 3 A/ft$^2$, and a total plating time of approximately 4 minutes. The thickness of the gold layer 111c is approximately 0.25 microns plus or minus 0.1 microns. After plating layers copper 111a, nickel 111b and gold 111c, the photoresist layer 1019 is stripped.

Figure 11:
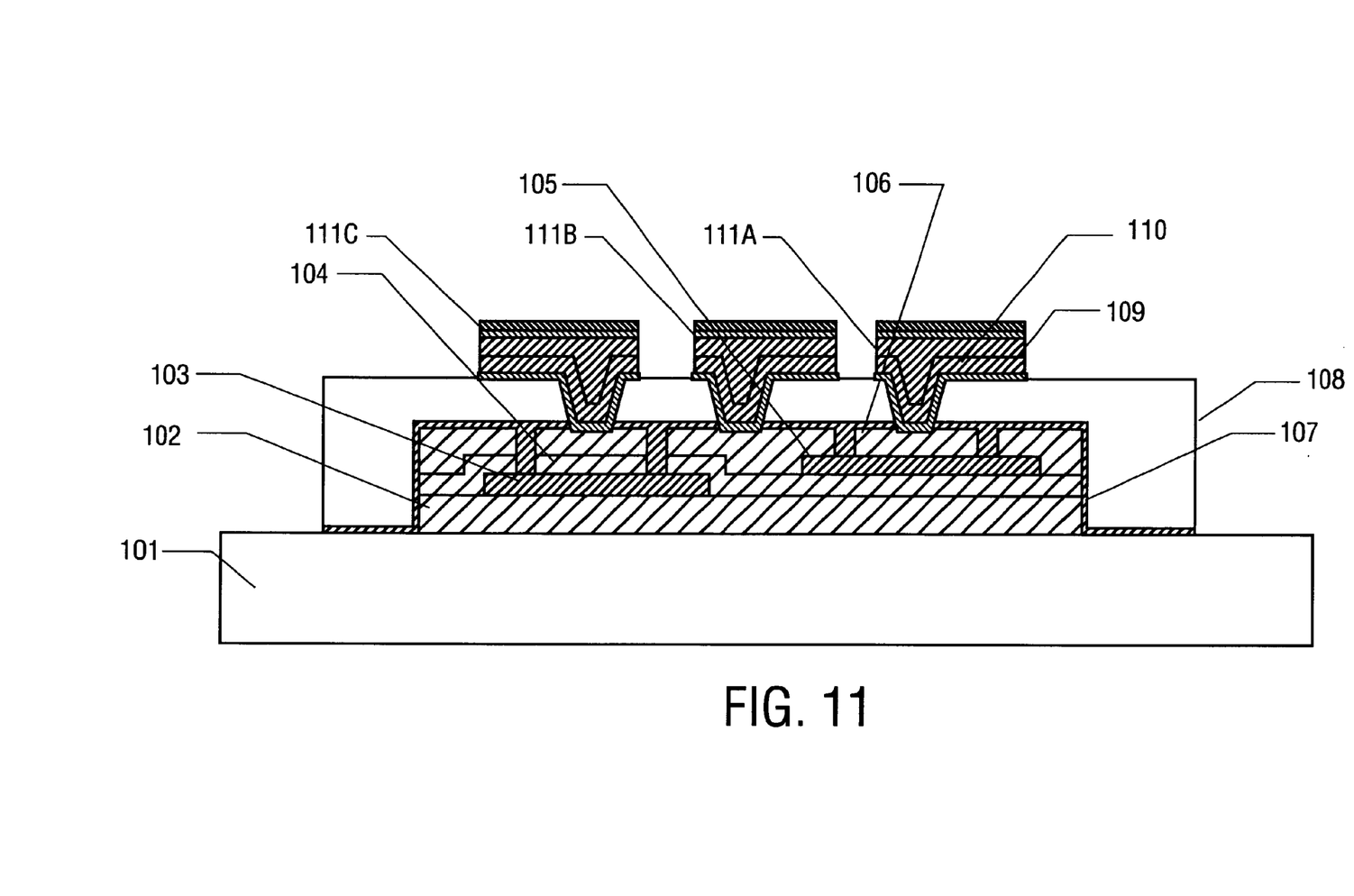
FIG. 11 shows the structure after etching the copper seed layer and the adhesion layer.

FIG. 11 shows the residual copper seed layer 110 and titanium adhesion layer 109 after etching. After stripping photoresist 1019 in FIG. 10, the copper seed layer 110 is stripped. For one embodiment of this invention, the copper etching is carried out in a solution that contains 15 grams of ammonium persulfate per gallon of DI water. The tank size is 24 gallons. There are 360 grams of ammonium persulfate per bath. The solution temperature is approximately 24 degree Centigrade plus or minus two degrees Centigrade. The etching time is approximately 9 minutes. After wet etching copper seed layer 110, the adhesion layer 109 is stripped. For one embodiment, the adhesion layer etching is performed by a Reactive Ion Etch (RIE) process in a model AKT1600 ETCH. The dry etching condition used is $SF_6$/$O_2$=300/20 sccm, 30 mT, and 1000 W, which for titanium, for example, takes approximately 5 minutes to strip 0.03 microns. In this operation, metal interconnects and pads for solder ball or wire bonds are formed.

Figure 12:
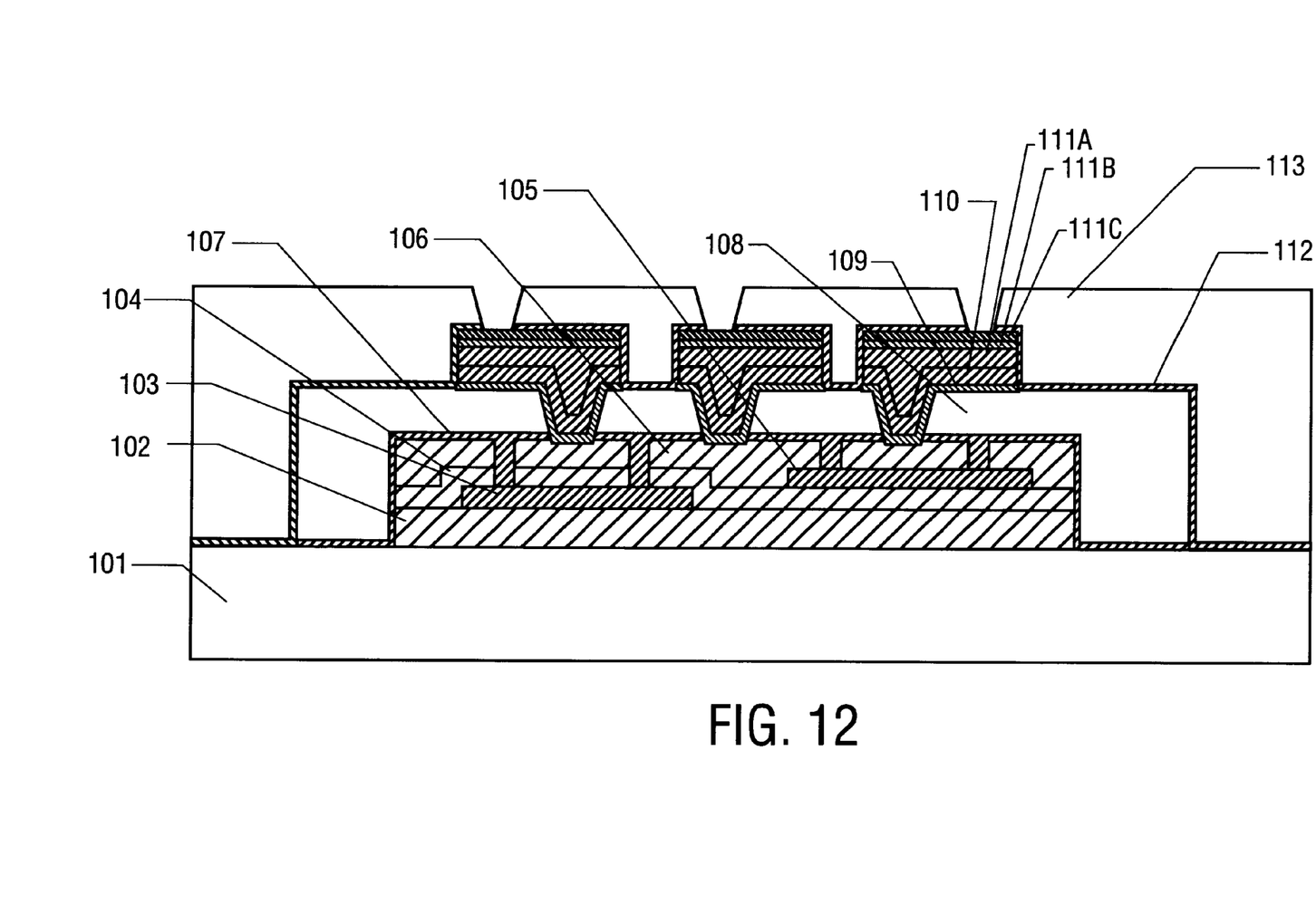
FIG. 12 shows the deposition of an impervious inorganic dielectric layer and a polymer dielectric layer.

FIG. 12 shows the deposition of an impervious inorganic dielectric layer 112 to cap the major device layers and to improve adhesion of passivation layer 113 to the gold layer 111c. For one embodiment, silicon nitride is used for the inorganic dielectric layer 112. For one embodiment, the SiNx layer is deposited by a Plasma Enhanced Chemical Vapor Deposition (PECVD) system in a model AKT1600 CVD system. The PECVD condition used is $SiH_4$/$NH_3$/$N_2$= 160/675/2000 sccm, 1.1 Torr, 1500 W, 210° C., and 110 seconds, which results in a thickness of approximately 0.3 microns. The other techniques for deposition of the inorganic dielectric layer are spin-on glass, sputter, evaporation, APCVD (Atmospheric CVD), LPCVD (Low Pressure CVD), Laser Ablation Deposition, ECR Plasma CVD, etc. Other materials that can be used as an impervious inorganic layer are silicon dioxide, silicon-oxy-nitride, aluminum oxide, tantalum oxide, etc., and the combination of these films.

The next operations in the process flow involve depositing a polymeric film (passivation layer 113) on top of the impervious inorganic film (inorganic dielectric layer 112). For one embodiment of the invention, BCB is used as passivation layer 113. The process for depositing BCB is as follows for one embodiment. The substrates are coated with a 34% diluted BCB 4024-40 on a FSI FP-BGBCD spin coater. The spin speed is 900 rpm. The resulting thickness of the BCB (passivation layer 113) is approximately 5.5 microns plus or minus 0.5 microns, on top of the final conductive metal layer 111 and approximately 9 microns, plus or minus 1 micron, on areas excluding the final conductive layer 111. The glass panel 101 is then automatically transferred to a hot plate for soft baking at approximately 75 degrees Centigrade for approximately 3 minutes. The patterning of the panel is accomplished using a MRS 5001-HT stepper. The exposure is 800 mJ/cm$^2$. The pattern is developed in a developer DS2100.

The next operation in the process flow is to hard bake the structure on glass panel 101 in a nitrogen purged oven. The hard bake temperature is approximately 210 degrees Centigrade for approximately 40 minutes. Including ramp up and ramp down, the total baking time is approximately 4 hours. The oxygen concentration is less than 100 ppm. The hard baking occurs in a Blue M electric oven.

The next operation is the BCB descum and etching the inorganic dielectric layer 112. For one embodiment, the BCB descum and the SiNx dry etch are performed by a Reactive Ion Etch (RIE) process in a model AKT1600 Etch system. The descum condition used is $O_2/CF_4$=80/20 sccm, 80 mT, 1000 W, and 60 seconds, which results in etching 0.06–0.08 microns of BCB. The dry etch condition used is SF6/O2/Ar=300/10/150 sccm, 40 mT, and 900 W, which results in etching 0.3 microns of, for example, SiNx, in approximately 90 seconds. The etching end point is detected by an optical endpoint detector.

The fabrication process described above in reference to FIGS. 2–12 shows one embodiment of an integrated passive device integrating an anodized metal capacitor and an HTD capacitor. FIGS. 2–12 describe a process wherein fabrication of the dielectric layer of the anodized metal capacitor (i.e., metal oxide layer 103) is fabricated before the dielectric layer of the HTD capacitor (i.e., dielectric film layer 105).

Other embodiments are possible, for example, the order can be reversed. The following is a description of an alternative embodiment wherein the order of certain process flow operations is reversed. For the alternative embodiment, conductive metal layer 102 is deposited onto substrate 101, as described above. The next operation, however, is to deposit the dielectric film layer onto conductive metal layer 102 to form a HTD capacitor. For one embodiment of the invention, silicon nitride (SiNx) is used. For one embodiment of the invention, the SiNx layer (the dielectric film layer) is deposited by a Plasma Enhanced Chemical Vapor Deposition (PECVD) system in a model AKT1600 CVD system of Applied Komatsu Technology of Santa Clara, Calif. The PECVD condition used is SiH4/NH3/N2=100/500/3500 sccm, 1.2 Torr, 1200 W, 320° C., and 340 seconds, which results in a thickness of the SiNx of approximately 0.65 microns. The other techniques for the dielectric film depositions include sputter, evaporation, APCVD (Atmospheric CVD), LPCVD (Low Pressure CVD), Laser Ablation deposition, ECR plasma CVD, spin coat, extrusion coat, roller coat, etc. Other materials that can be used as a dielectric film include silicon dioxide, silicon-oxy-nitride, aluminum oxide, tantalum oxide, titanium oxide, BCB, polyamide, etc., and the combination of these films.

The next operation is the deposition of a photoresist layer on top the dielectric film layer. The process for depositing the photoresist layer is as follows for one embodiment. The structure on glass panel 101 is coated with a positive AZ-4330 photoresist on an FSI FP-BGBCD spin coater. The resulting thickness of the photoresist layer is approximately 3.7 microns plus or minus 0.1 microns. The glass panel 101 is then automatically transferred to a hot plate for soft baking at approximately 110 degrees Centigrade for approximately 2 minutes. The patterning of the structure on glass panel 101 is accomplished using a MRS 5001-HT stepper. The pattern is developed in a 4 to 1 mixture of water and the developer AZ 400K. Then the structure on glass panel 101 is hard baked at a temperature of approximately 125 degrees Centigrade for approximately 30 minutes.

The next operation is etching of the dielectric film layer. For one embodiment, SiNx is used as the dielectric film layer. The SiNx is etched by a Reactive Ion Etch (RIE) process in a model AKT1600 ETCH system. The RIE conditions used are $SF_6/O_2/Ar$=300/10/150 sccm, 40 mT, and 900 W, which results in etching 0.65 microns of the SiNx in approximately 200 seconds. After dry etching of the dielectric film layer, the photoresist layer is stripped. In this operation, the dielectric layer for the HTD capacitor is patterned.

The high-temperature deposition of the dielectric film layer to form the HTD capacitor may have caused hillocking in the conductive metal layer 102. The cause and effect of hillocking is described above. Also, the dry etching process may have left contaminants on conductive metal layer 102. The next operation, the deposition of a fresh conductive metal layer on top of the dielectric film layer, helps avoid the fabrication problems caused by hillocking and contaminants.

For one embodiment, the fresh conductive metal layer is aluminum. For an alternative embodiment, the fresh conductive metal layer may be any anodizable metal, or multilayer of metal that includes anodizable metal, that exhibits sufficient adhesion to the dielectric film layer. The metal used for the fresh conductive metal layer need not be the same metal used for conductive metal layer 102. For one embodiment, however, the same metal is used in the fresh conductive metal layer as is used in conductive metal layer 102. For one embodiment, aluminum is used for both layers. The thickness of the fresh conductive metal layer depends upon the metal. For one embodiment of the invention, the thickness of the fresh conductive metal layer is approximately 0.1 microns. For one embodiment the fresh conductive metal layer is thick enough to reduce the hillocking generated by the previous high temperature deposition. The range of the thickness used can be 0.01–1.0 microns, but other thicknesses are also possible.

For an embodiment using glass panel 101, the protective conductive metal layer is deposited by a sputter process using aluminum in a Kurdex V3000 sputtering system. The sputter conditions are as follows. The sputtering starts with in situ RF plasma etching for approximately 120 seconds, followed by an aluminum deposition with a condition of Ar 100 sccm, 4000 W, Scan Speed 498 mm/min, and 2 mTorr. This results in a nominal thickness of the aluminum (protective conductive metal layer) of approximately 0.1 microns.

The next operation is the formation of the anodized metal capacitor's dielectric layer. The protective conductive metal layer is coated with a photoresist layer. For one embodiment, a positive photoresist is used. In particular, for one embodiment, the positive photoresist is one of the AZ™ 4000 series of photoresists. Alternative embodiments use other photoresist processes, including positive or negative photoresist processes. The thickness of the photoresist needs to be optimized for the specific process. If the photoresist is too thin, the photoresist will not have sufficient chemical resistance. If the photoresist is too thick, the precise pattern definition will be more difficult to achieve. For certain embodiments, photoresist thicknesses can range from about 1 micron to 10 microns, but other thicknesses are possible. An embodiment for a glass panel is coated with a positive AZ-4330 on an FSI FP-BGBCD spin coater. The glass panel patterning done on a MRS 5001-HT stepper. The preferred hard bake for the photoresist layer is the minimum temperature required to perform successful anodization. In particular, for the AZ-4330 photoresist, the hard baked temperature is approximately between 170 degrees Centigrade and 220 degrees Centigrade for approximately 30 minutes, plus or minus five minutes. The preferred temperature is approximately 190 degrees. The hard baking occurs in a Blue M electric oven.

After coating with photoresist, the panels are anodized to produce a metal oxide layer. For an embodiment using aluminum as the protective conductive metal layer, the metal oxide layer is a layer of aluminum oxide $Al_2O_3$.

Anodization occurs by applying to the top of the wafer or panel a mixture of ammonium pentaborate in an ethylene glycol solution. The pH of the solution is maintained between approximately 5.0 and 5.5. The temperature of the solution is approximately 15–30 degrees Centigrade.

The anodization parameters comprise a forming voltage of approximately 130 volts, a current density of approximately 0.1–10 mA/cm$^2$, and a total anodization time of approximately 1–30 minutes. The thickness of the metal oxide layer is approximately 0.15–0.2 microns. After anodization, the photoresist layer is stripped using a stripper.

The next operation in the process flow is to perform a radio frequency ("RF") plasma etch on the top of the panel to clean the top surface of the protective conductive metal layer and the metal oxide layer. The RF plasma etch cleans the protective conductive metal layer and the metal oxide layer, but the RF plasma etch does remove a small amount of the metal oxide layer. The RF plasma etch typically removes approximately 0.004 to 0.005 microns of the 0.15–0.2 micron thickness of metal oxide layer. For one embodiment, the RF plasma etch is done in a sputtering machine that uses argon ions in an RF plasma to bombard the protective conductive metal layer and the metal oxide layer. The sputtering machine is calibrated based on a known thickness of the metal oxide layer. For one embodiment, the RF plasma etch typically takes approximately 2 minutes. For an alternative embodiment for a glass panel, the sputtering uses in situ RF plasma etching for approximately 120 seconds.

The remainder of the process is substantially the same as then process described above in reference to FIGS. 6–12.

The process described in reference to FIGS. 2–12 shows the integration of two types of capacitors, but it is possible to make three or more different types of capacitors by repeating the processes described in reference to FIGS. 3–5.

Figure 13:
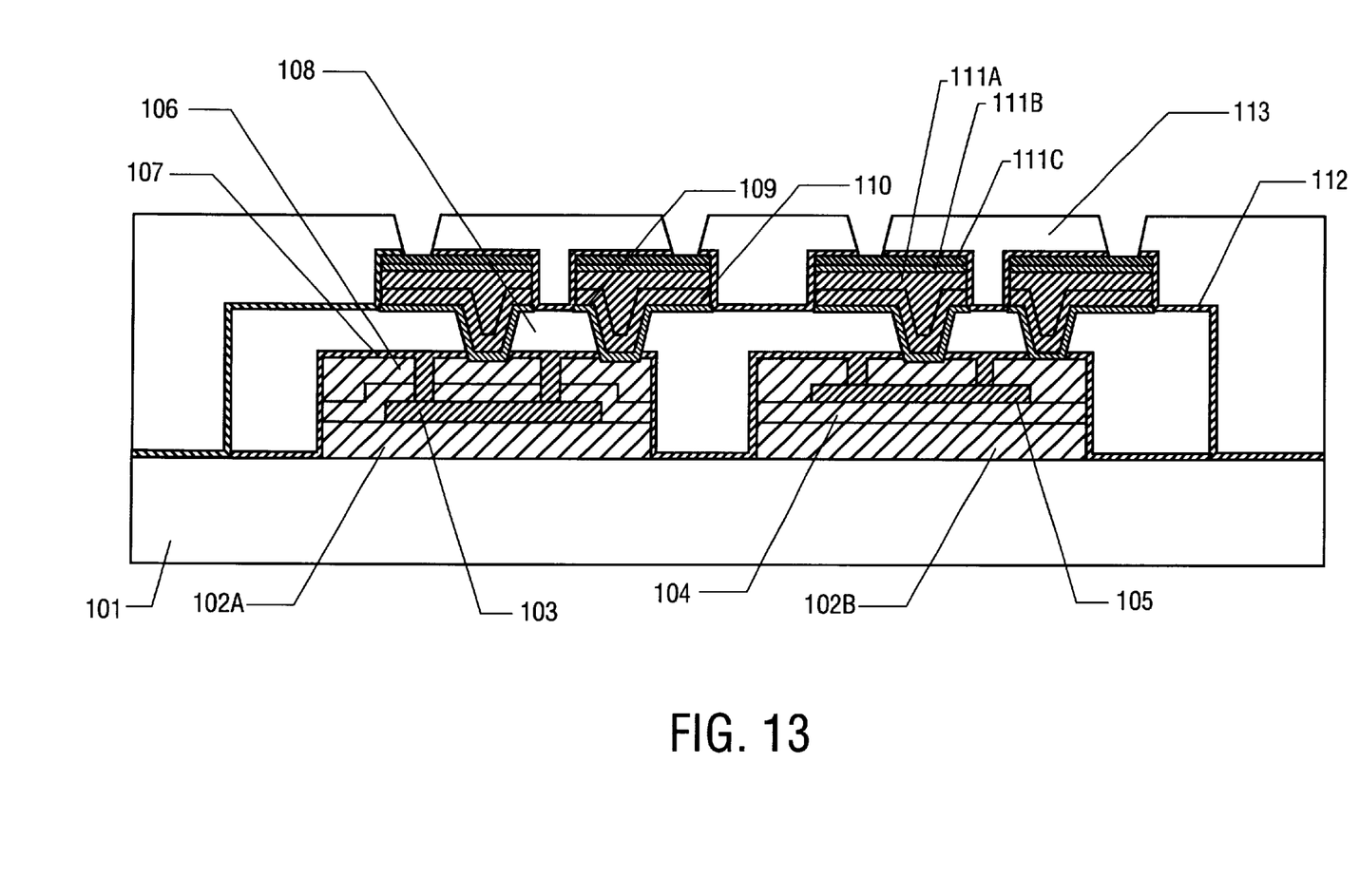
FIG. 13 shows a device integrating an anodized metal capacitor and a HTD capacitor in accordance with an embodiment of the present invention.

FIG. 13 shows another example of thin film integrated capacitors made using the same process as FIG. 1. The example shows an embodiment of the present invention with two capacitors that have separated ground plates, 102a and 102b. The example shows only two capacitors but the number of capacitors is not so limited. Other quantities of capacitors are possible. For example, there could be three or more capacitors of different types.

Figure 14:
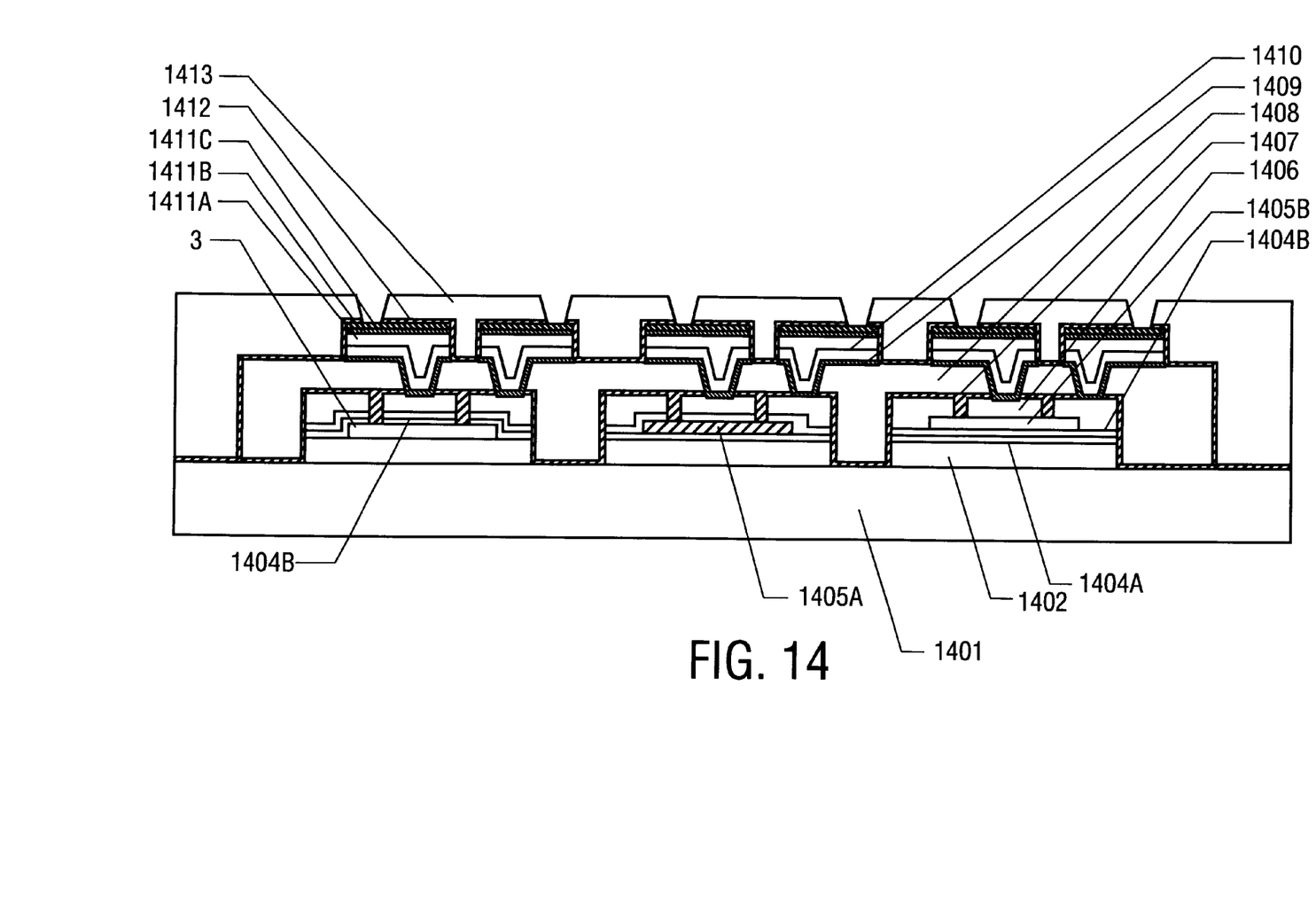
FIG. 14 shows a device integrating 3 different capacitors into one device.

A further example of integrating more than two different types of capacitors in one device using a single masking step is shown in FIG. 14. As shown in FIG. 14, one embodiment of a method for integrating three or more different capacitors into one device includes repeating the operation of depositing a protective conductive metal layer. For alternative embodiments of multiple capacitor integrated devices, repeating the process of depositing a protective conductive metal layer may not be necessary. Where the dielectric layers of two capacitors are to be formed from widely dissimilar materials, the etching of one may not have adverse affects upon the formation of the other. For example, if a silicon nitride layer was deposited first, the protective conductive layer might not be necessary if a polyimide layer was deposited next. Patterning the polyimide layer would not affect the silicon nitride layer. The device of FIG. 14 is made using the same fundamental process of FIGS. 2–12. The difference is that after the etching of the photoresist layer 517 as described in reference to FIG. 5, the process of preparing the surface and depositing a protective conductive metal layer (shown in FIG. 14 as 1404b) is repeated. Then the process of fabricating a dielectric layer (shown in FIG. 14 as 1405b) to form another type of capacitor is repeated. The process then continues as in FIGS. 2–12.

The process described above in reference to FIG. 14 describes a device in which three capacitor types are implemented. In principle the extension of the process depicted by FIG. 14 could be repeated many times, giving many different capacitor types with the final patterning being done at the end. This allows the patterning of multiple capacitor types using only one masking operation.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated device comprising:
   a first capacitor of a first type;
   a second capacitor of a second type; and
   a protective conductive metal layer disposed between a dielectric layer of the first capacitor and a dielectric layer of the second capacitor, the protective conductive metal layer helping to prevent process chemicals and conditions used to fabricate the dielectric layer of the second capacitor from adversely affecting the dielectric layer of the first capacitor.

2. The integrated device of claim 1, wherein the dielectric layer of the first capacitor comprises the same material as the dielectric layer of the second capacitor, and wherein the dielectric layer of the first capacitor has a different thickness than the dielectric layer of the second capacitor.

3. The integrated device of claim 1, wherein the dielectric layer of the first capacitor comprises a different material than the dielectric layer of the second capacitor.

4. The integrated device of claim 1, wherein the first capacitor is an anodized metal capacitor.

5. The integrated device of claim 4, wherein the second capacitor is a high temperature deposition capacitor.

6. The integrated device of claim 1, further comprising:
   a third capacitor, of a third type; and
   a conductive metal layer disposed between a dielectric layer of the second capacitor and a dielectric layer of the third capacitor, the conductive metal layer helping to prevent hillocking of an underlying layer of the device or contamination from adversely affecting the fabrication of a dielectric layer of the third capacitor.

7. The integrated device of claim 5, wherein the dielectric layer of the first capacitor is a layer of aluminum oxide approximately 0.15 microns thick.

8. The integrated device of claim 5, wherein the protective conductive metal layer is a material selected from the group consisting essentially of aluminum, copper, gold, molybdenum, silver, tantalum, titanium, tungsten, and alloys thereof.

9. The integrated device of claim 5, wherein the dielectric layer of the second capacitor is a material selected from the group consisting essentially of BCB, Avatrel™ hydrocarbon, and polyimide.

10. The integrated device of claim 5, wherein the dielectric layer of the second capacitor is a material selected from the group consisting essentially of silicon nitride, silicon dioxide, silicon oxy-nitride, aluminum oxide, tantalum oxide, titanium oxide, and the multi-layer of these materials.

11. The integrated device of claim 6, wherein the second capacitor is a high temperature deposition capacitor and the third capacitor is a high temperature deposition capacitor, the thickness of the dielectric layer of the third capacitor being different from the thickness of the dielectric layer of the second capacitor.

12. The integrated device of claim 6, wherein the second capacitor is a high temperature deposition capacitor and the third capacitor is a high temperature deposition capacitor, having a dielectric layer comprising a material different than the dielectric layer of the second capacitor.

13. The integrated device of claim 5, wherein the dielectric layer of the second capacitor is a layer of silicon nitride approximately 0.65 microns thick.

14. The integrated device of claim 5, wherein the dielectric layer of the second capacitor is a layer of BCB approximately 1–5 microns thick.

15. The integrated device of claim 5, wherein the protective conductive metal layer is a layer of aluminum approximately 0.1 microns thick.

16. A multi-layered structure for an integrated device comprising:

an anodized metal layer;

a dielectric film layer; and a protective conductive metal layer disposed between the anodized metal layer and the dielectric film layer, the protective conductive metal layer helping to protect the anodized metal layer from process chemicals and conditions used to fabricate the dielectric film layer.

17. The multi-layered structure of claim 16, wherein the process chemicals and conditions include a reactive ion etching process.

18. The multi-layered structure of claim 16, wherein the integrated device contains passive components.

19. The multi-layered structure of claim 16, wherein the integrated device contains active components.

20. The multi-layered structure of claim 16, wherein the integrated device contains passive and active components.

21. The multi-layered structure of claim 16, wherein the anodized metal layer is a dielectric layer of an anodized metal capacitor and the dielectric film layer is a dielectric layer of a high temperature deposition capacitor.

22. The multi-layered structure of claim 16, wherein the dielectric film layer is a material selected from the group consisting essentially of BCB, Avatrel™ hydrocarbon, and polyimide.

23. The multi-layered structure of claim 16, wherein the dielectric film layer is a material selected from the group consisting essentially of silicon nitride, silicon oxide, silicon oxy-nitride, aluminum oxide, tantalum oxide, titanium oxide, and the multi-layer of these materials.

24. The multi-layered structure of claim 16, wherein the dielectric film layer is a layer of silicon nitride approximately 0.65 microns thick.

25. The multi-layered structure of claim 16, wherein the dielectric film layer is a layer of BCB approximately 1–5 microns thick.

26. The multi-layered structure of claim 16, wherein the anodized metal layer is a layer of aluminum oxide approximately 0.15 microns thick.

27. The multi-layered structure of claim 16, wherein the protective conductive metal layer is a material selected from the group consisting essentially of aluminum, copper, gold, molybdenum, silver, tandalum, titanium, tungsten, and alloys thereof.

28. The multi-layered structure of claim 16, wherein the protective conductive metal layer is a layer of aluminum approximately 0.1 microns thick.

29. An integrated device comprising:

a substrate;

a conductive metal layer deposited upon the substrate;

an anodized metal layer formed upon the conductive metal layer;

a protective conductive metal layer deposited upon the anodized metal layer; and a dielectric film layer deposited upon the protective conductive metal layer, the protective conductive metal layer helping to protect the anodized metal layer from process chemicals and conditions associated with the deposition of the dielectric film layer.

30. The integrated device of claim 29, wherein the conductive metal layer is deposited by a sputtering process.

31. The integrated device method of claim 29, wherein process chemicals and conditions are chemicals and conditions associated with a reactive ion etching process.

32. The integrated device of claim 29, wherein the integrated device contains passive components.

33. The integrated device of claim 29, wherein the integrated device contains active components.

34. The integrated device of claim 29, wherein the integrated device contains passive and active components.

35. The integrated device of claim 29, wherein the anodized metal layer is a dielectric layer of an anodized metal capacitor and the dielectric film layer is a dielectric layer of a high temperature deposition capacitor.

36. The integrated device of claim 29, wherein the dielectric film layer is a material selected from the group consisting essentially of BCB, Avatrel™ hydrocarbon, and polyimide.

37. The integrated device of claim 29, wherein the dielectric film layer is a material selected from the group consisting essentially of silicon nitride, silicon oxide, silicon oxy-nitride, aluminum oxide, tantalum oxide, titanium oxide, and the multi-layer of these materials.

38. The integrated device of claim 29, wherein the dielectric film layer is a layer of silicon nitride approximately 0.65 microns thick.

39. The integrated device of claim 29, wherein the dielectric film layer is a layer of BCB approximately 5.4 microns thick.

40. The integrated device of claim 29, wherein the anodized metal layer is a layer of aluminum oxide approximately 0.15 microns thick.

41. The integrated device of claim 29, wherein the protective conductive metal layer is a material selected from the group consisting essentially of aluminum, copper, gold, molybdenum, silver, tantalum, titanium, tungsten, and alloys thereof.

42. The integrated device of claim 29, wherein the protective conductive metal layer is a layer of aluminum approximately 0.1 microns thick.

43. An integrated component device comprising:

a substrate;

a first conductive metal layer deposited upon the substrate;

a dielectric film layer deposited upon the first conductive metal layer; and an anodized metal layer formed upon a second conductive metal layer, the second conductive metal layer disposed between the dielectric film layer and the anodized metal layer, the second conductive layer helping to prevent hillocking or contamination of the first conductive metal layer from adversely affecting the formation of the anodized layer upon the second conductive layer.

44. The integrated device of claim 43, wherein the second conductive metal layer is a multilayer of metal having an anodizable metal layer.

* * * * *